United States Patent [19]

Padmanabhan et al.

[11] Patent Number: 5,776,831
[45] Date of Patent: Jul. 7, 1998

[54] METHOD OF FORMING A HIGH ELECTROMIGRATION RESISTANT METALLIZATION SYSTEM

[75] Inventors: Gobi R. Padmanabhan, Sunnyvale; Prabhakar P. Tripathi, Santa Clara, both of Calif.

[73] Assignee: LSI Logic Corporation, Milpitas, Calif.

[21] Appl. No.: 578,118

[22] Filed: Dec. 27, 1995

[51] Int. Cl.⁶ .................................................. H01L 21/283
[52] U.S. Cl. .......................... 438/653; 438/655; 438/656; 438/664; 438/688
[58] Field of Search .................................. 438/653, 655, 438/656, 664, 685, 688, 350, 360

[56] References Cited

U.S. PATENT DOCUMENTS

| | | | |
|---|---|---|---|
| 5,155,063 | 10/1992 | Ito | 438/637 |
| 5,240,880 | 8/1993 | Hindman et al. | 438/649 |
| 5,242,860 | 9/1993 | Nulman et al. | 438/653 |
| 5,312,772 | 5/1994 | Yokoyama et al. | 438/643 |
| 5,356,836 | 10/1994 | Chen et al. | 438/627 |
| 5,360,996 | 11/1994 | Nulman et al. | 257/767 |
| 5,420,072 | 5/1995 | Fiordalice et al. | 438/607 |
| 5,449,641 | 9/1995 | Maeda | 438/653 |
| 5,455,197 | 10/1995 | Ghanbazi et al. | 438/685 |
| 5,604,155 | 2/1997 | Wang | 438/626 |
| 5,654,235 | 8/1997 | Matsumoto et al. | 438/643 |

FOREIGN PATENT DOCUMENTS

| | | |
|---|---|---|
| 50-29256 | 3/1975 | Japan. |
| 62-32610 | 2/1987 | Japan. |
| 63-175420 | 7/1988 | Japan. |

Primary Examiner—T. N. Quach
Attorney, Agent, or Firm—Luedeka, Neely & Graham, P.C.

[57] ABSTRACT

A method of forming a metallization system in which ohmic contact is made to a silicon surface is described. A first layer of titanium is formed over the silicon surface. This first titanium layer is subsequently annealed in a nitrogen atmosphere to convert a first portion of the layer to a layer of titanium silicide, and a second portion to a first layer of titanium nitride. The titanium silicide layer provides for the formation of an ohmic contact between the metallization system and the silicon surface. The first titanium nitride layer provides for a degree of spike resistance between the silicon surface and the metallization system. A second layer of titanium nitride is formed over the first titanium nitride layer. This second titanium nitride layer provides further spike resistance between the silicon surface and the metallization system. A second titanium layer is then formed over the second titanium nitride layer, and acts to wet the surface of the second layer of titanium nitride, and aides in the flow of subsequently deposited layers across the second titanium nitride layer. An aluminum layer is formed over the second titanium layer, for providing a low ohmic resistance path for the flow of electrons through the metallization system. Finally, a third titanium nitride layer is formed over the aluminum layer.

18 Claims, 2 Drawing Sheets

METHOD OF FORMING A HIGH ELECTROMIGRATION RESISTANT METALLIZATION SYSTEM

FIELD OF THE INVENTION

The present invention relates to the field of semiconductor metallization systems. More particularly, the invention relates to the field of aluminum metallization systems which make contact with silicon surfaces.

BACKGROUND OF THE INVENTION

In a semiconductor device, metal interconnect layers function to electrically connect the device's different components. Metal interconnect layers generally comprise contacts, which connect the layer to the semiconductor device and other interconnect layers, and traces, which electrically connect the contacts. Aluminum has long been a preferred material for forming the interconnect layers, because it is relatively inexpensive and easy to work with.

Unfortunately, using aluminum as the interconnect layer on a typical silicon semiconductor can create problems with the devices formed in the silicon. For example, when the aluminum is deposited on the silicon surface the two materials tend to intermix to some degree at their interface. The aluminum tends to migrate even further into the silicon during subsequent deposition or anneal processes. This condition, known as spiking, can create short circuits in the device when the migrated aluminum spikes through an active region in the silicon device.

Other problems also exist with the use of aluminum in metal interconnect layers. For example, after aluminum has carried a current for a time, a phenomenon known as electromigration may occur. Electromigration is the process of redistributing aluminum, caused by the force of electron flow, or current. The redistributed aluminum may leave voids and thin spots in the traces, causing open circuits in the interconnect layer. This problem is especially prevalent in the narrower aluminum traces required by the increasingly smaller semiconductor devices being manufactured.

Further, aluminum tends to be a very reflective material. This creates problems during photolithographic processes which follow the aluminum deposition and pattern the traces of the interconnect layer. For example, failure to carefully control the exposure energy delivered to a photoresist layer on top of aluminum may cause the traces being formed to be either too wide or too narrow, as explained below.

When a reflective material such as aluminum is under the photoresist, it is difficult to adequately penetrate the photoresist layer without radiating surplus energy back into the photoresist. Unfortunately, the energy may reflect back along different paths than that by which it reached the surface of the aluminum, thus exposing other areas of the photoresist coating. This creates traces that, depending on the type of photoresist used, are either too wide or too narrow. This situation is increasingly problematic, because as device geometries shrink, so too must the width of the interconnect layer traces shrink, making trace width control more important.

To prevent aluminum from spiking when it is used as the interconnect material, a layer of another material may be placed between the aluminum and the silicon to act as a barrier to the diffusion of one into the other. Unfortunately, those materials which are traditionally used as a barrier layer are either insufficiently thick, because they are formed according to self-limiting reactions, or they impart undesirable characteristics to the aluminum layer which prevent it from being optimally resistant to electromigration.

In addition, the surface of traditional barrier layers is not easily wet by the aluminum. In other words, the aluminum does not flow well across it. In certain areas of an interconnect layer, such as wide flat areas where traces are formed, the reduced ability of aluminum to wet the barrier layer surface is not a substantial problem in creating the device. However, in other areas of the interconnect layer, such as in plug contact regions where the aluminum must fill a deep, narrow via, the inability of the aluminum to adequately flow across the barrier layer is a substantial problem affecting device reliability.

What is needed then, is a metallization system which does not spike through a semiconducting substrate and can be used in a deep plug fill process, but which exhibits a high resistance to electromigration. Further, such a system is needed that reduces the problems of aluminum surface reflectivity that are so prevalent in small dimension devices.

SUMMARY OF THE INVENTION

The above and other needs are met by a multiple layer metallization system for making ohmic contact with a silicon surface, according to the present invention. In one embodiment, the invention provides an area of titanium silicide disposed at the silicon surface. A first titanium nitride layer having a (111) crystallographic orientation is disposed over the titanium silicide area. A second titanium nitride layer is disposed over the first titanium nitride layer. A first titanium layer having a (002) crystallographic orientation is disposed over the second titanium nitride layer. An aluminum layer having a (111) crystallographic orientation is disposed over the second titanium layer. A third titanium nitride layer is disposed over the aluminum layer.

In a second embodiment the invention provides a multiple layer metallization system for making an ohmic contact with a silicon surface. A first layer of titanium is formed over the silicon surface, and is subsequently annealed in a nitrogen atmosphere to convert a first portion of the first titanium layer which is adjacent the silicon surface to a titanium silicide layer, and to convert a second portion of the first titanium layer which is exposed to the nitrogen atmosphere to a first titanium nitride layer. The titanium silicide layer forms an ohmic contact between the silicon surface and the metallization system. The first titanium nitride layer provides spike resistance between the silicon surface and the metallization system.

A second titanium nitride layer is formed over the first titanium nitride layer, and provides further spike resistance between the silicon surface and the metallization system. A second titanium layer is formed over the second titanium nitride layer, and wets the surface of the second titanium nitride layer. The second titanium layer also aids in the flow of subsequently deposited layers across the second titanium nitride layer.

An aluminum layer is formed over the second titanium layer, and provides a low ohmic resistance path for the flow of electrons through the metallization system. A third titanium nitride layer is formed over the aluminum layer, and improves the electromigration resistance of the metallization system. The third titanium nitride layer also provides an anti-reflective coating for the metallization system.

A third embodiment relates to a method of forming a multiple layer metallization system for making ohmic contact to a silicon surface. A first layer of titanium is deposited over the silicon surface. The first titanium layer is annealed in a nitrogen atmosphere to convert a first portion of the first titanium layer which is adjacent the silicon surface to a titanium silicide layer, and to convert a second portion of the first titanium layer which is exposed to the nitrogen atmosphere to a first titanium nitride layer.

A second titanium nitride layer is deposited over the first titanium nitride layer. A second titanium layer is deposited over the second titanium nitride layer. An aluminum layer is deposited over the second titanium layer. A third titanium nitride layer is deposited over the aluminum layer.

BRIEF DESCRIPTION OF THE DRAWINGS

Further advantages of the invention will become apparent by reference to the detailed description of preferred embodiments when considered in conjunction with the following drawings, in which like reference numerals denote like elements throughout the several views, and wherein.

DETAILED DESCRIPTION OF THIS INVENTION

Figure 1:
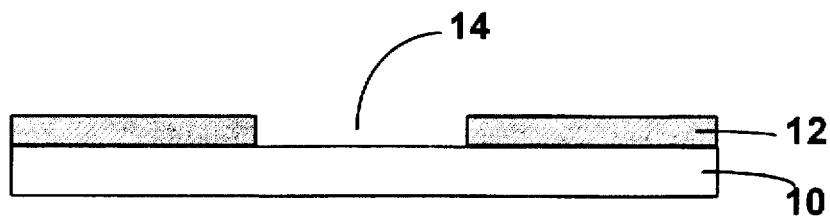
FIG. 1 is a cross-sectional view of a via to the silicon surface of a semiconducting device.

Referring now to the drawings. FIG. 1 depicts a substrate 10 overlaid with a layer 12. The substrate 10 may be formed of various semiconducting materials, such as silicon, germanium, or gallium-arsenide and other III-V compounds. The advantages of the present invention are best exemplified when the substrate is comprised of silicon. Similarly, the layer 12 may also be formed of a variety of different dielectric materials, but is preferably formed of a dielectric material which does not appreciably react with the metals of the interconnect layer to be formed. Such materials include, for example, silicon oxide or borophosphosilicate glass.

There is formed in the layer 12 a via to the surface of the substrate 10, such as via 14. The features of via 14, as depicted in the several drawings, are not necessarily to scale. The via 14 extends from the top surface of the layer 12 to the top surface of the substrate 10. The present invention more particularly applies when the ratio of the depth of the via 14 to the breadth of the via 14 is close to or greater than one. However, the invention is equally applicable to via 14 where the ratio is far less than one. To facilitate understanding of the invention, the several drawings depict a via 14 with an aspect ratio less than one so that the features of the drawings will not be unnecessarily small.

A good barrier material forms an ohmic contact between the silicon substrate 10 and the other portions of the interconnect system. Titanium is a good barrier material, because it reacts with and penetrates silicon to form titanium silicide. But, unlike aluminum, titanium requires higher temperatures to drive it into silicon, and only penetrates to a certain depth. Subsequent heat processing does not cause titanium to spike through silicon as does aluminum.

Figure 2:
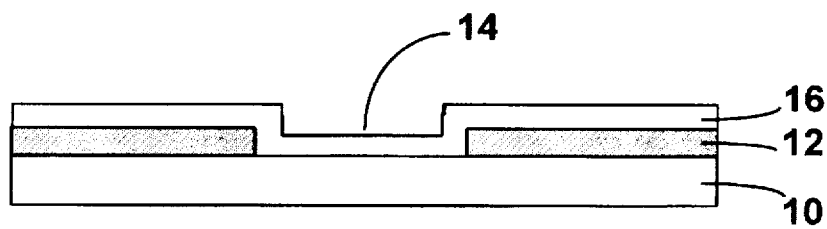
FIG. 2 is a cross-sectional view of a first titanium layer as deposited on the silicon surface.

FIG. 2 shows a first layer 16 of titanium deposited on top of the substrate 10 and layer 12. In the preferred embodiment the titanium layer 16 is between about 100 Å and about 600 Å thick, and is most preferably about 400 Å in thickness. In an alternate embodiment, the exposed surfaces of the layer 12 and the substrate 10 are prepared for the titanium layer 16 by heating them in a furnace at a temperature of between about 420° C. to about 450° C., sufficient to drive out any moisture which may be adsorbed on the exposed surfaces. This generally requires between about fifteen minutes and about sixty minutes, and most preferably about thirty minutes.

The titanium layer 16 may be deposited by any one of a number of techniques known to those with ordinary skill in the art. In a preferred embodiment the first titanium layer 16 is formed by sputter deposition. Also preferably, a collimator is used during the titanium deposition process, so that the titanium atoms arrive at the surface of the substrate 10 along paths which are nearly normal to the plane of the surface of the substrate.

By employing a collimator during the deposition process, the first titanium layer 16 tends to grow in thickness most rapidly in a direction normal to the surface of the substrate 10, and not appreciably in a transverse direction, such as against the side walls of the via 14. In the preferred embodiment there are no excessive deposits of titanium on the side walls of the via 14, because the metal so deposited may form bridges at the entrance to the via 14, and gaps and holes in the metal at the bottom of the via 14.

A sputterer such as a Varian M2000 M2I, made by Varian Associates of Palo Alto, Calif., may be used for any of the metal deposition steps which are described herein.

After the first titanium layer 16 is deposited, the composite, which represents the substrate 10 with all layers deposited prior to the point in time in question, is annealed in a nitrogen enriched atmosphere. While the anneal may be accomplished in a variety of ways, such as by a furnace anneal, in a preferred embodiment a rapid thermal anneal is performed. Suitable methods for annealing the titanium layer 16 are described in U.S. Pat. Nos. 5,360,996 and 5,155,063, which are incorporated here by reference. The nitrogen is preferably supplied by nitrogen gas, but may alternately be supplied by ammonia gas or other nitrogen rich gases used in the art.

Figure 3:
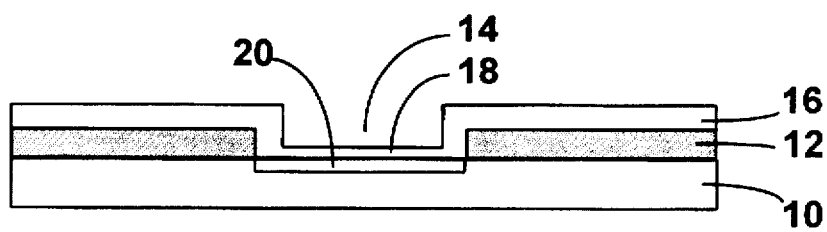
FIG. 3 is a cross-sectional view of the first titanium layer after annealing in a nitrogen atmosphere.

As known in the art, annealing at these conditions causes the first titanium layer 16 to undergo some specific changes. The titanium which is overlaying the exposed portion of the substrate 10 within the via 14 reacts with the silicon of the substrate 10 to form a titanium silicide layer 20 as depicted in FIG. 3. During this process about half of the thickness of the titanium layer 16 is consumed in forming the titanium silicide 20. Similarly, a portion of the silicon of the substrate 10 is also consumed, and so the titanium silicide layer 20 extends below the surface of the substrate 10. The formation of the titanium silicide layer 20 proceeds according to a self-limiting reaction. Once the layer 20 is formed to a certain thickness, the reaction stops, and titanium will not be driven into the substrate 10 to a greater depth. In the preferred embodiment the titanium silicide is about 400 Å thick.

The top surface of the first titanium layer 16, which is exposed to the nitrogen atmosphere, is converted to a first titanium nitride layer 18 during the anneal. This reaction is also self-limiting, so that only that titanium of the layer 16 which is within about 400 Å of the top surface of the layer 16 reacts to form the first titanium nitride layer 18. In the preferred embodiment the titanium nitride is about 400 Å thick.

Thus, the two concurrent reactions, silicidation at the bottom surface of the titanium layer 16, and nitridation at the top surface of the titanium layer 16, are competing for material. While all of the titanium of the layer 16 which is deposited on top of the layer 12 may be converted to titanium nitride, the material which is deposited within the via 14 will preferably be divided about half and half to the formation of titanium nitride and titanium silicide.

The titanium silicide layer 20 and the titanium nitride layer 18 provide specific advantages to the semiconductor device. The titanium silicide layer 20 helps create an ohmic contact between the silicon substrate 10 and the subsequently deposited metallic layers which form the balance of the metallization system according to the invention. The titanium nitride layer 18 provides at least two distinct benefits to the invention. Titanium nitride is resistant to the diffusion of aluminum and silicon. This forms a good barrier between the aluminum which will be subsequently deposited on the substrate 10. Also, thermally grown titanium nitride, which is formed by nitridation as explained above, has a (111) crystal orientation. When aluminum is deposited over a (111) layer, such as the titanium nitride layer 18, the aluminum layer also assumes the (111) crystallographic orientation. Advantageously, a (111) aluminum layer is less susceptible to electromigration than aluminum layers having other crystallographic orientations.

A titanium nitride layer with a thickness of only about 400 Å is generally insufficient to completely prevent aluminum migration into the silicon below the titanium nitride. While it would be beneficial to use the nitridation process to grow a thicker titanium nitride layer, the process is self limiting, as discussed above, to a thickness of about 400 Å. Therefore, a thermally grown titanium nitride layer is preferably supplemented with a sputtered titanium nitride layer.

However, the sputtered titanium nitride does not exhibit the preferred (111) orientation that the thermal titanium nitride does. Rather, a sputtered titanium nitride layer has either a (200) crystallographic orientation, or is polycrystalline. So while the additional thickness of titanium nitride helps prevent the aluminum from spiking into the silicon, it does so at the loss of the desired (111) orientation. Thus, the sputtered titanium nitride layer may actually reduce the electromigration resistance properties of the metallization system, unless compensating measures are provided as described below.

Figure 4:
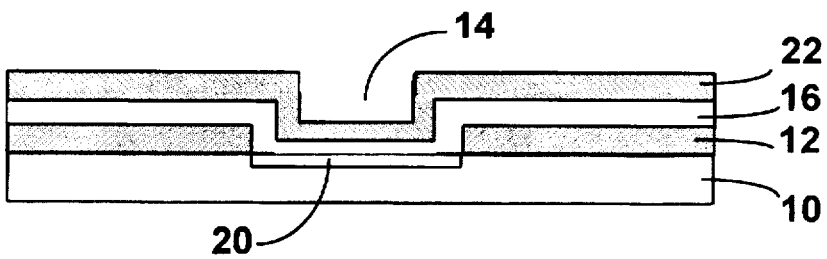
FIG. 4 is a cross-sectional view of a second titanium nitride layer as deposited on the first titanium nitride layer.

After converting the first titanium layer 16 to the titanium silicide layer 20 and the first titanium nitride layer 18, a second titanium nitride layer 22 is deposited by reactive sputter on top of the first titanium nitride layer 18, as depicted in FIG. 4. In the preferred embodiment the second titanium nitride layer 22 is between about 200 Å and about 1,000 Å thick, and is most preferably about 500 Å thick.

Figure 5:
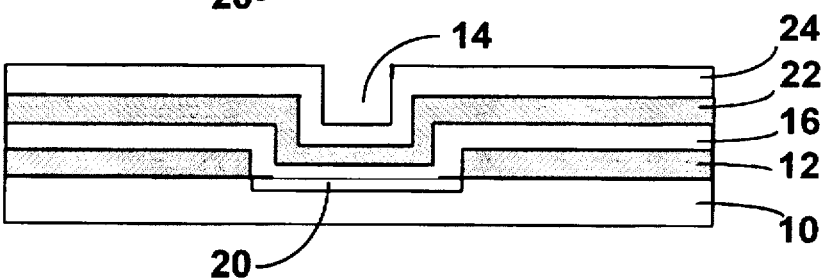
FIG. 5 is a cross-sectional view of a second titanium layer as deposited on the second titanium nitride layer.

After depositing this additional thickness of titanium nitride 22, which helps prevent the aluminum from spiking into the silicon, a second layer of titanium 24, as depicted in FIG. 5, is deposited. In an alternate embodiment, the second titanium nitride layer 22 may be prepared for the second titanium layer 24 by annealing in a furnace at a temperature of between about 420° C. to about 450° C. for a length of time of between about fifteen minutes and about sixty minutes. Such conditions are typically adequate to drive out any moisture which may be adsorbed on the exposed surface of the layer. In the preferred embodiment, the second titanium layer 24 is between about 100 Å and about 600 Å thick, and is most preferably about 400 Å thick. The second titanium layer 24 is preferably sputter deposited.

The second titanium layer 24 performs several beneficial functions, which are not readily apparent from its physical characteristics. For example, the second titanium layer 24 is easily wet by aluminum, and thus the subsequently deposited aluminum layer flows easily over the surface of the second titanium layer 24. This characteristic of the second titanium layer 24 allows the subsequently deposited aluminum layer to be deposited at a lower temperature than is otherwise desirable. This benefit is explained in greater detail below.

In addition, the second titanium layer 24 exhibits a (002) orientation. While this may not immediately be seen as a benefit, (002) being an unpreferred orientation for aluminum, aluminum deposited on top of a (002) titanium film as per the present invention assumes the preferred (111) orientation. In other words, the present invention does not require an aluminum layer of a metal interconnect system to be deposited immediately after a titanium nitride layer having a (111) orientation. Thus, the metallization system of the present invention is able to provide the benefits of both the additional spike resistance supplied by the sputtered titanium nitride film, and the electromigration resistance inherent in a (111) aluminum film.

Figure 6:
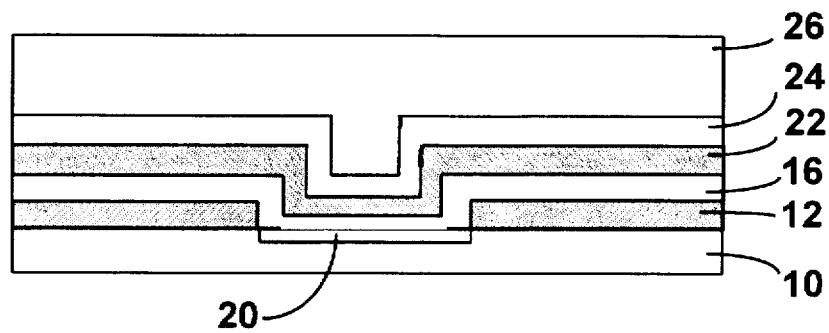
FIG. 6 is a cross-sectional view of an aluminum layer as deposited on the second titanium layer.
Figure 7:
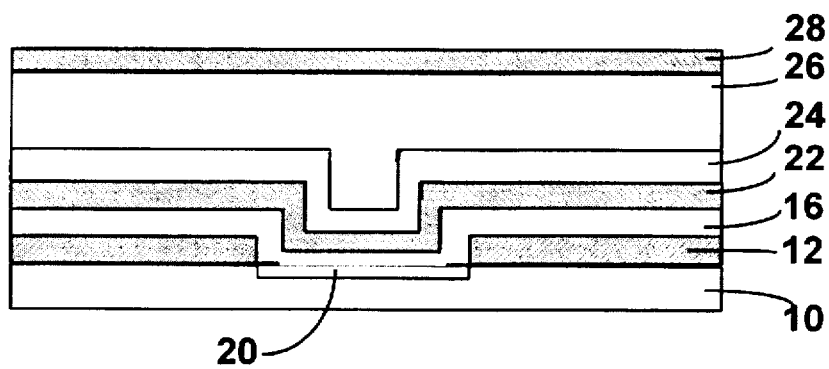
FIG. 7 is a cross-sectional view of a third titanium nitride layer as deposited on the aluminum layer.

After the second titanium layer 24 is deposited, an aluminum layer 26, as depicted in FIG. 6, which provides the low ohmic resistance portion of the metallization system, is deposited. In the preferred embodiment the aluminum layer 26 is between about 6,000 Å and about 10,000 Å thick, and is most preferably about 7,200 Å thick. While pure aluminum may be used for the layer, in a preferred embodiment an aluminum/copper 0.5% layer is used. In an alternate embodiment an aluminum/copper 0.5%/silicon 1% layer is also preferred. It will be appreciated that the invention is equally applicable to other similar aluminum compositions as well.

The aluminum may be deposited in two separate stages, characterized by deposition at two different temperatures. A first portion of the aluminum layer 26 may be deposited in what is termed a cold process, and the final portion in what is termed a hot process.

In a plug fill process, such as where a relatively deep and narrow via 14 is being filled, and for which this invention is particularly suited, it is preferred that the first thickness of the aluminum layer 26 be deposited cold. At higher temperatures the aluminum will generally nucleate and grow large, single crystal structures. These structures may tend to clog the entrance to the via 14 as explained above, and result in incomplete fill of the via 14. However, aluminum deposited at cooler temperatures generally fails to adequately wet on the surface of the preceding layer as described above, and so traditional techniques tend to prefer warmer deposition temperatures.

Thus there is a conflict between competing priorities during the deposition of the aluminum layer 26. On one hand, aluminum deposited cold does not bridge the vias 14, but it also does not wet the surface of the underlying layer well. On the other hand, aluminum deposited hot wets the surface of the underlying layer well, but tends to bridge the vias 14. The present invention overcomes this problem. The second titanium layer 24, deposited immediately prior to the aluminum layer 26, is easily wet by cold deposited aluminum. Thus, the aluminum layer 26 may be deposited cold, and both of the above mentioned problems are resolved. Additionally beneficial, the aluminum layer 26 adopts the preferred (111) crystallographic orientation, as discussed above.

The final portion of the aluminum layer 26 may be deposited hot. This favors the formation of the large, single crystal structures which are not preferred in the early stages of the deposition. At the stages of later deposition, however, these large crystal structures result in an aluminum layer 26 with lower electrical resistance and greater electromigration resistance.

In a preferred embodiment the cold aluminum is deposited at a temperature below about 200° C., and the hot aluminum is deposited at a temperature between about 450° C. and about 550° C. Preferably about 25% to about 70% of the total thickness of the aluminum layer 26 is deposited cold, and the remaining thickness is deposited hot, and most preferably about 50% of the thickness of the aluminum layer 26 is deposited by each of the cold and hot processes.

Figure 8:
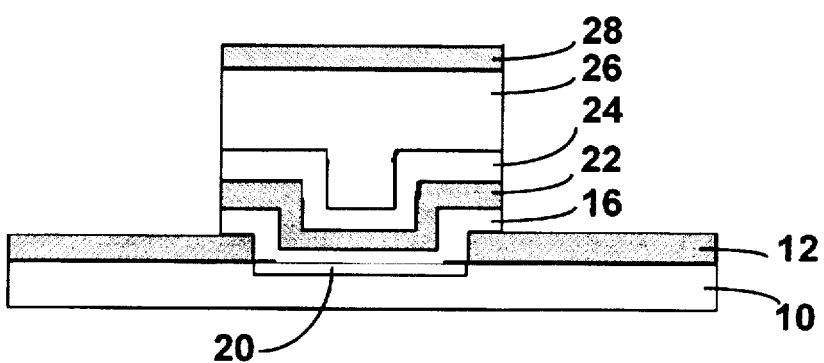
FIG. 8 is a cross-sectional view of the metallization system after patterning.

The aluminum layer 26 is overlaid with a third titanium nitride layer 28, which in the preferred embodiment is at least 250 Å thick. While this film may be deposited by any one of a number of different methods, it is preferably deposited by a reactive titanium sputter in a nitrogen environment. The third titanium nitride layer 28 not only helps reduce electromigration in the aluminum layer 26, but is also less reflective than the hot deposited portion of the aluminum layer 26. This latter characteristic provides for a good anti-reflective coating. Therefore, the final patterned metallization system, as depicted in FIG. 8, is able to be finely controlled as to width of the features created.

Thus, a semiconductor device having metal interconnects manufactured according to the present invention will have the benefits of high electromigration resistance and well patterned interconnects.

An example of a preferred method of forming the metallization system is now given.

EXAMPLE

The exposed surfaces of the layer 12 and the substrate 10 are prepared for the first titanium layer 16 by heating them in a furnace with a nitrogen over-pressure at a temperature of about 450° C. for about thirty minutes. A first layer 16 of titanium, about 400 Å thick, is deposited on top of the substrate 10 and the layer 12. The titanium layer 16 is deposited by sputter deposition using a collimator in a Varian M2000 M2I sputterer, which may be used for all of the metal deposition steps described in this example, unless stated otherwise. The first titanium layer 16 is deposited in the presence of an argon plasma by a technique of either PVD (sputtering deposition) or CVD to a thickness of about 1000 Å.

The composite is rapid thermal annealed in two steps. The anneal temperature of the first step does not exceed about 695° C., and the temperature of the second step is about 800° C. The temperature is stepped quickly between the first and second steps of the anneal with the second step lasting from 5 to about 180 seconds. The anneal is done in a nitrogen gas atmosphere. During the anneal, the titanium which is overlaying the exposed portion of the substrate 10 forms a titanium silicide layer 20 about 400 Å thick. The top surface of the first titanium layer 16, to a depth of about 400 Å, is converted to a first titanium nitride layer 18.

A second titanium nitride layer 22, about 500 Å thick, is reactively sputter deposited on top of the first titanium nitride layer 18 with a (200) crystallographic orientation.

The composite is again annealed in a furnace with a nitrogen over-pressure at a temperature of about 450° C. for about thirty minutes, and a second layer of titanium 24 is deposited. The second titanium layer 24 is reactively sputter deposited to about 400 Å thick, and exhibits a (002) orientation.

An aluminum/copper 0.5% layer 26 is next deposited to a thickness of 7,200 Å. The aluminum is deposited in two separate stages, a cold process and a hot process, and adopts the preferred (111) crystallographic orientation. The cold aluminum is deposited at a temperature of about 150° C., and the hot aluminum is deposited at a temperature of about 500° C. About 50% of the total thickness of the aluminum layer 26 is deposited cold, and the remaining thickness is deposited hot.

The aluminum layer 16 is overlaid with a third titanium nitride layer 28, which is about 400 Å thick. This film is deposited by a reactive titanium sputter in a nitrogen and argon mixture environment. The metallization system is patterned using any one of a number of different techniques well known in the art, none of which are essential to the present invention.

While preferred embodiments of the present invention are described above, it will be appreciated by those of ordinary skill in the art that the invention is capable of numerous modifications, rearrangements and substitutions of parts without departing from the spirit of the invention. It will also be appreciated that the invention has application to virtually the entire range of semiconductor devices, including without limitation RAM, PROM, EPROM, EEPROM, PAL, FPL, ASIC, and microprocessors fashioned according to CMOS, bipolar, and other techniques.

What is claimed is:

1. A method of forming a multiple layer metallization system for making ohmic contact to a silicon surface, comprising:

a) depositing a first layer of titanium over the silicon surface.

b) annealing the first titanium layer in a nitrogen bearing atmosphere to convert a first portion of the first titanium layer which is adjacent the silicon surface to a titanium silicide layer, and to convert a second portion of the first titanium layer which is exposed to the nitrogen bearing atmosphere to a first titanium nitride layer with a (111) orientation.

c) depositing a second titanium nitride layer with a (200) orientation over the first titanium nitride layer.

d) depositing a second titanium layer with a (002) orientation over the second titanium nitride layer.

e) depositing an aluminum or aluminum alloy layer with a (111) orientation over the second titanium layer, and f) depositing a third titanium nitride layer over the aluminum or aluminum alloy layer.

2. The method of claim 1 wherein the first titanium layer has a thickness of from about 100 Å to about 600 Å.

3. The method of claim 1 wherein the first titanium layer is formed by sputtering titanium over the silicon surface.

4. The method of claim 1 wherein the first portion of the first titanium layer is about fifty percent of the thickness of the entire first titanium layer, and the second portion of the first titanium layer is about fifty percent of the thickness of the entire first titanium layer.

5. The method of claim 1 wherein the anneal of the first titanium layer is accomplished by rapid thermal anneal.

6. The method of claim 1 wherein the nitrogen bearing atmosphere during the anneal of the first titanium layer is provided by nitrogen gas.

7. The method of claim 1 wherein the nitrogen bearing atmosphere during the anneal of the first titanium layer is provided by ammonia.

8. The method of claim 1 wherein the second titanium nitride layer has a thickness of between about 200 Å and about 1,000 Å.

9. The method of claim 1 wherein the second titanium nitride layer is formed by reactively sputtering titanium in a nitrogen environment over the first titanium nitride layer.

10. The method of claim 1 wherein the thickness of the second titanium layer is between about 100 Å and about 600 Å.

11. The method of claim 1 wherein the second titanium layer is formed by sputtering titanium over the second titanium nitride layer.

12. The method of claim 1 wherein the thickness of the aluminum layer is between about 6,000 Å and about 10,000 Å.

13. The method of claim 1 wherein the aluminum layer is formed by sputtering aluminum over the second titanium layer.

14. The method of claim 1 wherein the aluminum alloy layer further comprises an alloy of aluminum and copper.

15. The method of claim 1 wherein the aluminum alloy layer further comprises an alloy of aluminum, copper, and silicon.

16. The method of claim 1 wherein the thickness of the third titanium nitride layer is at least about 250 Å.

17. The method of claim 1 wherein the third titanium nitride layer is deposited by reactively sputtering titanium in a nitrogen atmosphere over the aluminum layer.

18. A method of forming a multiple layer metallization system for making ohmic contact to a silicon surface, comprising:

a) annealing the silicon surface in a furnace at a temperature of between about 420° C. to about 450° C., b) depositing a first layer of titanium over the silicon surface, c) annealing the first titanium layer in a nitrogen bearing atmosphere to convert a first portion of the first titanium layer which is adjacent the silicon surface to a titanium silicide layer, and to convert a second portion of the first titanium layer which is exposed to the nitrogen bearing atmosphere to a first titanium nitride layer, d) depositing a second titanium nitride layer over the first titanium nitride layer, e) annealing the second titanium nitride layer in a furnace at a temperature of between about 420° C. to about 450° C., f) depositing a second titanium layer over the second titanium nitride layer, g) depositing an aluminum or aluminum alloy layer over the second titanium layer, and h) depositing a third titanium nitride layer over the aluminum or aluminum alloy layer.

* * * * *